US 11,587,974 B2

(12) United States Patent
Kim et al.

(10) Patent No.: US 11,587,974 B2
(45) Date of Patent: Feb. 21, 2023

(54) MICRO LED TRANSFERRING METHOD AND DISPLAY MODULE MANUFACTURED BY THE SAME

(71) Applicant: SAMSUNG ELECTRONICS CO., LTD., Suwon-si (KR)

(72) Inventors: Byungchul Kim, Suwon-si (KR); Doyoung Kwag, Suwon-si (KR); Eunhye Kim, Suwon-si (KR); Sangmoo Park, Suwon-si (KR); Minsub Oh, Seoul (KR); Dongyeob Lee, Suwon-si (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 430 days.

(21) Appl. No.: 16/861,728

(22) Filed: Apr. 29, 2020

(65) Prior Publication Data
US 2020/0343297 A1    Oct. 29, 2020

(30) Foreign Application Priority Data

Apr. 29, 2019  (KR) .................. 10-2019-0049989

(51) Int. Cl.
*H01L 33/00* (2010.01)
*H01L 27/15* (2006.01)
*H01L 33/38* (2010.01)

(52) U.S. Cl.
CPC ........ *H01L 27/156* (2013.01); *H01L 33/0095* (2013.01); *H01L 33/38* (2013.01)

(58) Field of Classification Search
None
See application file for complete search history.

(56) References Cited

U.S. PATENT DOCUMENTS

| | | | |
|---|---|---|---|
| 7,848,594 B2 | 12/2010 | Yoshikawa |
| 8,455,179 B2 | 6/2013 | Yamamoto |
| 8,646,505 B2 | 2/2014 | Bibl et al. |
| 10,755,958 B2 | 8/2020 | Arai |
| 10,804,425 B2 | 10/2020 | Moon et al. |

(Continued)

FOREIGN PATENT DOCUMENTS

| | | |
|---|---|---|
| EP | 3486946 A1 | 5/2019 |
| JP | 2008-060608 A | 3/2008 |

(Continued)

OTHER PUBLICATIONS

Communication dated Dec. 14, 2021 by the European Patent Office in European Patent Application No. 20798390.9.

(Continued)

*Primary Examiner* — Bradley Smith
(74) *Attorney, Agent, or Firm* — Sughrue Mion, PLLC

(57) ABSTRACT

A micro light emitting diode (LED) transferring method includes setting a micro LED transfer substrate and a target substrate to initial positions and transferring a plurality of micro LEDs arranged in a partial region of the micro LED transfer substrate to the target substrate. Once the micro LEDs in the partial region are transferred to the target substrate, the micro LED transfer substrate is rotated and a plurality of micro LEDs, arranged in a remaining region of the micro LED transfer substrate, are then transferred to the target substrate.

6 Claims, 12 Drawing Sheets

(56) References Cited

U.S. PATENT DOCUMENTS

| | | | |
|---|---|---|---|
| 2010/0259164 A1 | 10/2010 | Oohata et al. | |
| 2012/0092389 A1 | 4/2012 | Okuyama | |
| 2013/0285086 A1 | 10/2013 | Hu et al. | |
| 2018/0068995 A1* | 3/2018 | Kajiyama | H01L 25/13 |
| 2018/0190633 A1 | 7/2018 | Thompson | |
| 2019/0157502 A1* | 5/2019 | Moon | H01L 27/153 |
| 2019/0198326 A1 | 6/2019 | Mikami et al. | |
| 2019/0221466 A1 | 7/2019 | Arai | |

FOREIGN PATENT DOCUMENTS

| | | |
|---|---|---|
| JP | 2009-283524 A | 12/2009 |
| JP | 5210052 B2 | 6/2013 |
| JP | 2018-49897 A | 3/2018 |
| JP | 2018-060993 A | 4/2018 |
| JP | 6406048 B2 | 10/2018 |
| KR | 10-2010-0138458 A | 12/2010 |
| KR | 10-1070202 B1 | 10/2011 |
| KR | 10-1900925 B1 | 9/2018 |

OTHER PUBLICATIONS

International Search Report dated Aug. 18, 2020 issued by the International Searching Authority in counterpart International Application No. PCT/KR2020/005549 (PCT/ISA/210).

International Written Opinion dated Aug. 18, 2020 issued by the International Searching Authority in counterpart International Application No. PCT/KR2020/005549 (PCT/ISA/237).

* cited by examiner

MICRO LED TRANSFERRING METHOD AND DISPLAY MODULE MANUFACTURED BY THE SAME

CROSS-REFERENCE TO RELATED APPLICATION(S)

This application is based on and claims priority under 35 U.S.C. § 119 to Korean Patent Application No. 10-2019-0049989, filed on Apr. 29, 2019, in the Korean Intellectual Property Office, the disclosure of which is incorporated by reference herein in its entirety.

BACKGROUND

Field

The disclosure relates to a micro light emitting diode (LED) transferring method of transferring a plurality of LEDs from a micro LED transfer substrate to a target substrate, and a display module manufactured by the same.

Description of the Related Art

A micro light emitting diode (LED) is an ultra-small inorganic light emitting material that emits light without using a color filter and a backlight unit. Specifically, the micro LED may refer to an ultra-small LED whose length is about $1/10$ of a general LED chip, area is about $1/100$ of the general LED chip, and whose width, length, and height are 10 to 100 micrometers (μm).

A plurality of micro LEDs may be grown and manufactured in a chip formed on a wafer (growth substrate) through an epitaxial process. The micro LEDs manufactured as described above may be transferred onto a target substrate for use in a display module.

A micro LED display panel is a flat panel display panel that includes inorganic LEDs each having a size of 100 micrometers or less. The micro LED display panel provides better contrast, response time, and energy efficiency than a liquid crystal display (LCD) panel requiring a backlight unit. Both of the organic LED (OLED) and the micro LED are energy efficient, but the micro LED has a higher brightness and luminous efficiency, as well as a longer lifespan than those of the OLED.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter Additional aspects will be set forth in part in the description which follows and, in part, will be apparent from the description, or may be learned by practice of the presented embodiments.

The disclosure provides a micro light emitting diode (LED) transferring method using a micro LED transfer substrate capable of maximizing a utilization rate for an entire region by making arrangement directions of a plurality of micro LEDs for each region different from each other, and a display module manufactured by the same.

Further, the disclosure provides a micro LED transferring method capable of significantly reducing a tack time by omitting a process of replacing a mask at the time of transferring micro LEDs arranged in each region of a micro LED transfer substrate, and a display module manufactured by the same.

According to an embodiment of the disclosure, a micro LED transferring method includes setting a micro LED transfer substrate and a target substrate to initial positions primarily and transferring a plurality of micro LEDs arranged in a partial region of the micro LED transfer substrate to the target substrate. The micro LED transfer substrate is then rotated and a plurality of micro LEDs arranged in a remaining region of the micro LED transfer substrate are transferred to the target substrate.

According to another embodiment of the disclosure, a display module includes: a glass substrate; a thin film transistor (TFT) layer formed on one surface of the glass substrate; a plurality of first micro LEDs transferred from a partial region of a micro LED transfer substrate; and a plurality of second micro LEDs, having an arrangement direction different from that of the plurality of first micro LEDs on the micro LED transfer substrate, transferred from a remaining region of the micro LED transfer substrate.

According to still another embodiment of the disclosure, a non-transitory computer readable recording medium storing instructions, the instructions including one or more instructions that, when executed by one or more processors of a device, cause one or more processors to execute a micro LED transferring method. The micro LED transferring method includes setting a micro LED transfer substrate and a target substrate to initial positions; transferring a plurality of micro LEDs arranged in a partial region of the micro LED transfer substrate to the target substrate; rotating the micro LED transfer substrate; and transferring a plurality of micro LEDs arranged in a remaining region of the rotated micro LED transfer substrate to the target substrate.

BRIEF DESCRIPTION OF THE DRAWINGS

The above and other aspects and features of certain embodiments of the present disclosure will be more apparent from the following description taken in conjunction with the accompanying drawings, in which.

DETAILED DESCRIPTION

Figure 1:
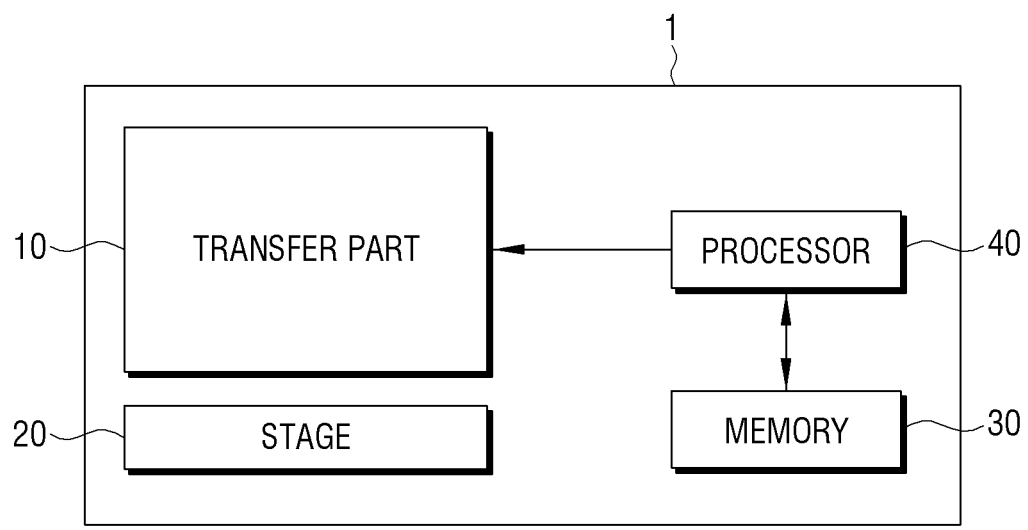
FIG. 1 is a block diagram schematically illustrating a micro light emitting diode (LED) transfer apparatus according to an embodiment.

To sufficiently understood configurations and effects of the disclosure, example embodiments of the disclosure will be described with reference to the accompanying drawings. However, the disclosure is not limited to the embodiments described below, which may be implemented in several forms and may be variously modified. A description of these embodiments will be provided only to make the disclosure complete and allow those skilled in the art to which the disclosure pertains to completely recognize the scope of the disclosure. In the accompanying drawings, sizes of components may be enlarged as compared with actual sizes for convenience of explanation, and ratios of the respective components may be exaggerated or reduced.

When a first component is described as being "on" or "in contact with" a second component, the first component may be in direct contact with the second component or may be connected to a third component that exist between the first component and the second component. On the other hand, when the first component is described as being "directly on" or "in direct contact with" the second component, a third component does not exist between the first component and the second component. Other expressions describing a relationship between components, for example, "between" and "directly between" may be similarly interpreted.

Terms such as 'first' and 'second' may be used to describe various components, but the components are not to be interpreted to be limited to these terms. These terms may be used only to distinguish one component from other components. For example, a first component may be named a second component and the second component may also be similarly named the first component, without departing from the scope of the disclosure.

Singular forms are intended to include plural forms unless the context clearly indicates otherwise. The terms "include", "have", or the like, may be interpreted to specify the presence of features, numerals, steps, operations, components, parts, and combinations thereof mentioned in the specification, or a combination thereof, but do not preclude the addition of one or more other features, numerals, steps, operations, components, parts, or combinations thereof.

Terms used in embodiments of the disclosure may be interpreted as having meanings that are generally known to those skilled in the art unless defined otherwise.

A display module according to the disclosure may be installed in and applied to a wearable device, a portable device, a handheld device, an electronic product, or an electrical component requiring various displays, in a single unit. The display module may also be applied to a display device such as a monitor for a personal computer (PC), a high resolution television (TV), a signage, or an electronic display through a plurality of assembly arrangements in a matrix type.

The display module manufactured according to embodiments of the disclosure may include a substrate having a thin film transistor (TFT) layer formed on one surface thereof, a plurality of micro light emitting diodes (LEDs) arranged in a state of being electrically connected to the TFT layer, and wirings electrically connecting circuits arranged on a rear surface of the substrate to each other. The substrate, which may correspond to a target substrate to be described later, may be any one of a glass substrate, a flexible substrate, or a plastic substrate, and may be referred to as a backplane.

The display module according to embodiments of the disclosure may include a rear substrate electrically connected to a rear surface of the substrate through a flexible printed circuit (FPC). The rear substrate may be formed in a thin film shape or a thin glass shape having a thickness of several tenths of a micrometer (μm) (for example, 50 μm or less). When the rear substrate is formed in the thin film shape, the rear substrate may be formed of a plastic material, for example, any one of polyimide (PI), polyethylene terephthalate (PET), polythersulfone (PES), polyethylene naphtalate (PEN), or polycarbonate (PC).

The substrate according to an embodiment of the disclosure may include side wirings formed on edge portions thereof. The side wirings may electrically connect first connection pads formed on edge portions of a front surface of the substrate and second connection pads formed on a rear surface of the substrate. To this end, the side wiring may be formed along the front surface, side end surfaces, and the rear surface of the substrate, and may have one end electrically connected to the first connection pad and the other end electrically connected to the second connection pad. In this case, the side wiring may be partially formed on the side surface of the substrate, and may thus protrude from a side surface of a TFT substrate by a thickness of the side wiring. In this case, the rear substrate may be electrically connected to the second connection pad through the FPC. A driver integrated circuit (IC) mounted on the rear surface of the TFT substrate may be directly connected to the second connection pad or be indirectly connected to the second connection pad through a separate wiring.

A plurality of display modules configured as described above may be arranged in a tiled type to provide a large display apparatus.

The micro LED according to the disclosure may be a semiconductor chip having a width, a length, and a height of 10 μm to 100 μm, formed of an inorganic light emitting material, and capable of emitting light by itself when power is supplied thereto.

The micro LED provides a fast reaction speed, low power, and high luminance. Specifically, a micro LED converts electricity to photons more efficiently than an existing liquid crystal display (LCD) or organic light emitting diode (OLED). That is, the micro LED has a higher "brightness per watt" than that of an existing LCD or OLED display. Therefore, the micro LED may achieve the same brightness as that of the existing LED (whose width, length, and height exceed 100 μm) or OLED with about a half of the energy expenditure of the existing LED or OLED.

In addition, the micro LED may implement a high resolution and an excellent color, contrast, and brightness, and may thus accurately express a wide range of colors and implement a clear screen even in the bright sunlight of the outdoors. In addition, the micro LED is resistant to a burn-in phenomenon and generates a small amount of heat, such that a long lifespan of the micro LED is ensured without deformation of the micro LED.

In addition, a transfer substrate mentioned in the disclosure may be a relay substrate in a state where a plurality of micro LEDs are transferred from a growth substrate on which the plurality of micro LEDs are grown, but is not limited thereto, and may be any substrate in a state where the micro LEDs can be transferred to a target substrate. Hereinafter, in the disclosure, the transfer substrate and the relay substrate may be used interchangeably.

Hereinafter, a structure of a micro LED transfer apparatus according to an embodiment of the disclosure will be described with reference to FIG. 1.

FIG. 1 is a block diagram schematically illustrating a micro LED transfer apparatus according to an embodiment of the disclosure.

Referring to FIG. 1, a micro LED transfer apparatus 1 according to an embodiment of the disclosure may include a transfer part 10 for transferring a plurality of micro LEDs arranged in a predetermined arrangement direction in a plurality of regions on a micro LED transfer substrate (hereinafter, referred to as a relay substrate 50 (see FIG. 2)) to a target substrate 70 (see FIG. 5). The micro LED transfer apparatus 1 may also include a stage 20 arranged adjacent to the transfer part 10 for moving the target substrate in X, Y, and Z axis directions, a memory 30 in which characteristic information of each of the plurality of micro LEDs is stored, and a processor 40 controlling the transfer part 10 and the stage 20 to determine positions where the plurality of micro LEDs are to be arranged, respectively, on the relay substrate 50 on the basis of the stored characteristic information and transfer the plurality of micro LEDs to the determined positions.

The transfer part 10 may simultaneously transfer predetermined micro LEDs from a relay substrate in which the plurality of micro LEDs are arranged to the target substrate in a laser lift off (LLO) process.

The transfer part 10 may include a laser oscillator 80 (see FIG. 6) for irradiating a laser beam toward the relay substrate 50 and a stage (not illustrated in FIG. 6) that may move the relay substrate 50 along an X axis, a Y axis, and a Z axis and rotate the relay substrate 50 around the Z axis, to perform a transfer process in the LLO process.

The stage 20 may detachably clamp the target substrate 70 on an upper surface of the stage 20, and may move along the X axis, the Y axis, and the Z axis and rotate around the Z axis in a state where it clamps the target substrate 70.

In addition, the micro LED transfer apparatus 1 may include the memory 30 and the processor 40.

The memory 30 may be implemented as at least one of a flash memory type, a read only memory (ROM), a random access memory (RAM), a hard disk type, a multimedia card micro type, or a card type memory (for example, a secure digital (SD) or XD memory).

In addition, the memory 30 may be electrically connected to the processor 40 to transmit a signal and information to the processor 40. Therefore, the memory 30 may store characteristic information of a plurality of micro LEDs that are input or irradiated and transmit the stored characteristic information to the processor 40.

The processor 40 controls a general operation of the micro LED transfer apparatus 1. That is, the processor 40 may be electrically connected to the transfer part 10 and the stage 20 to control each component.

For example, the processor 40 may control the transfer part 10 and the stage 20 to transfer a plurality of micro LEDs from growth substrates (not illustrated) to a temporary substrate (not illustrate), and transfer the plurality of micro LEDs from the temporary substrate to the relay substrate 50.

In addition, the processor 40 may control the transfer part 10 and the stage 20 to transfer the plurality of micro LEDs arranged on the relay substrate 50 to the target substrate 70. The disclosure is not limited to controlling all components by a single processor 40, and respective components of the micro LED transfer apparatus 1 may be controlled using a plurality of independent processors, respectively.

Here, the processor 40 may include one or more of a central processing unit (CPU), a controller, an application processor (AP), a communication processor (CP), or an ARM processor.

In addition, the processor 40 may be electrically connected to the memory 30 to use the characteristic information of the plurality of micro LEDs stored in the memory 30. The characteristic information of the plurality of micro LEDs may be data for securing uniformity in an entire arrangement of the plurality of micro LEDs at the time of transferring the plurality of micro LEDs from the growth substrates to the temporary substrate.

Specifically, a process of transferring the plurality of micro LEDs from each growth substrate to the relay substrate 50 through the temporary substrate (not illustrated) using the characteristic information of the plurality of micro LEDs may be as follows.

The processor 40 may inspect characteristics of a plurality of micro LEDs, each formed on red, green, and blue growth substrates, and analyzes luminance, wavelengths, and the like of the micro LEDs for each region of each growth substrate. An analysis results may be stored in the memory 30.

When the characteristic inspection is completed, the processor 40 may simulate a combination of each position for optimal arrangement of a plurality of red, green, and blue micro LEDs in which uniformity or the like is considered at the time of arranging the plurality of red, green, and blue micro LEDs from each growth substrate (not illustrated) onto the temporary substrate on the basis of the analysis result.

When the optimal arrangement of the plurality of red, green, and blue micro LEDs to be arranged on the temporary substrate is set through the simulation, the processor 40 may form a data map based on the optimal arrangement. A data map may be stored in the memory 30.

Subsequently, the micro LEDs of each growth substrate are sequentially transferred to a single temporary substrate for each color in the LLO process based on the data map. Alternatively, the micro LEDs of each growth substrate may be transferred to corresponding respective temporary substrates.

The plurality of micro LEDs transferred to the temporary substrate as described above may be transferred to the relay substrate 50 in the LLO process.

Hereinafter, a structure of the relay substrate 50 according to an embodiment of the disclosure will be described with reference to FIGS. 2 to 4.

Figure 2:
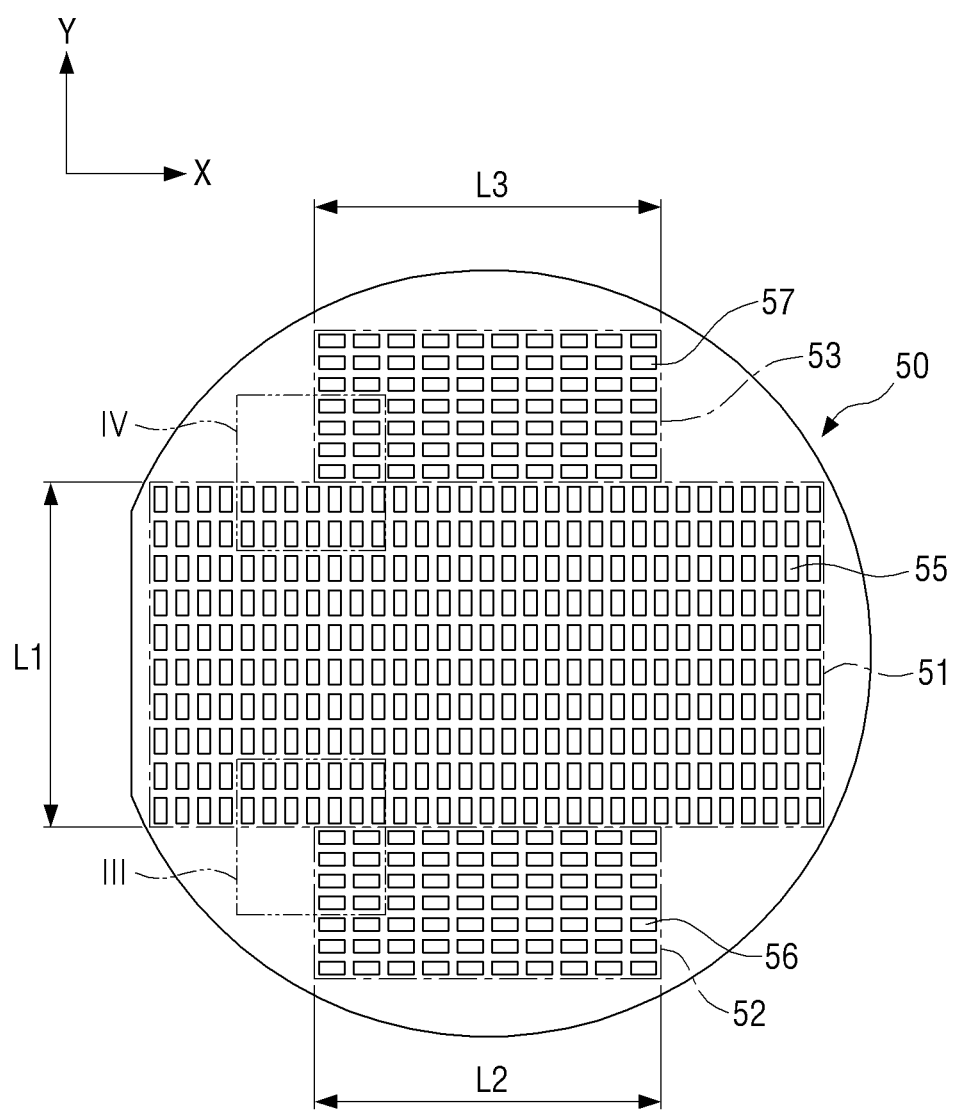
FIG. 2 is a plan view illustrating a micro LED transfer substrate according to an embodiment.
Figure 3:
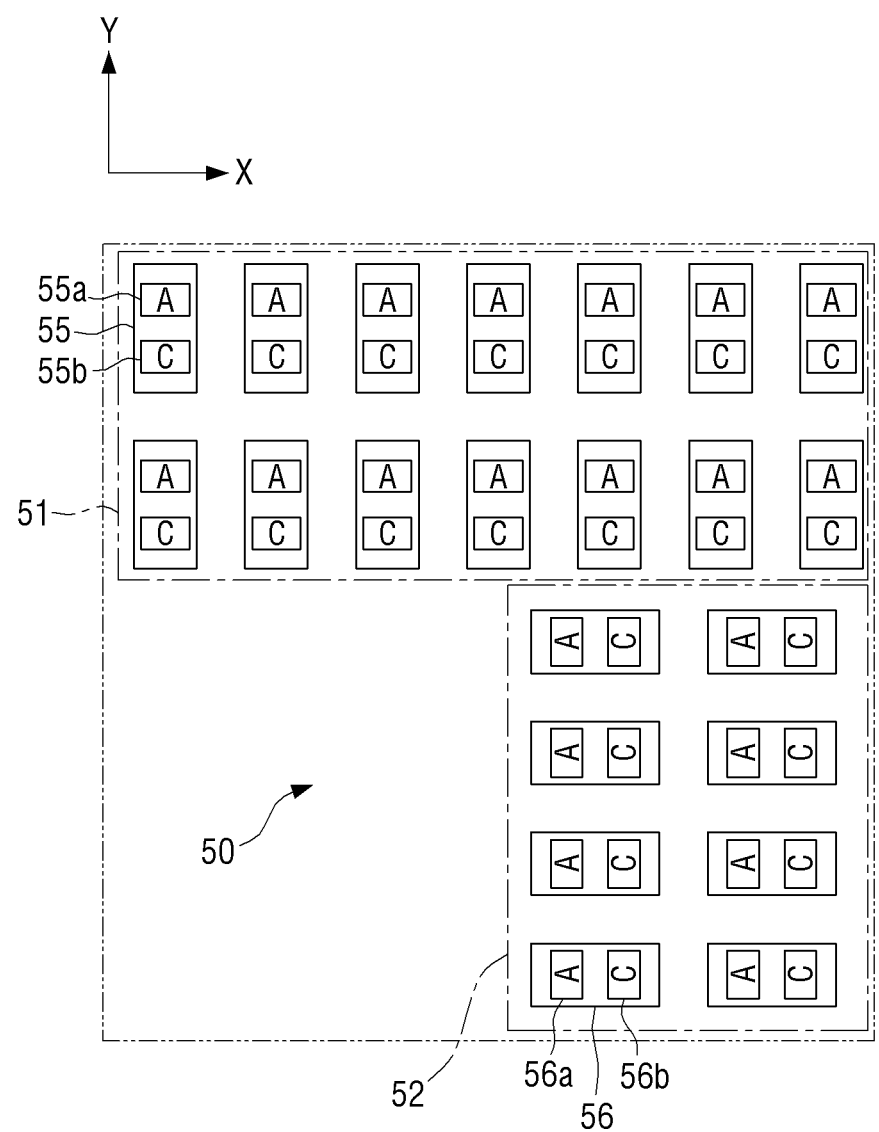
FIG. 3 is an enlarged view of section III illustrated in FIG. 2.
Figure 4:
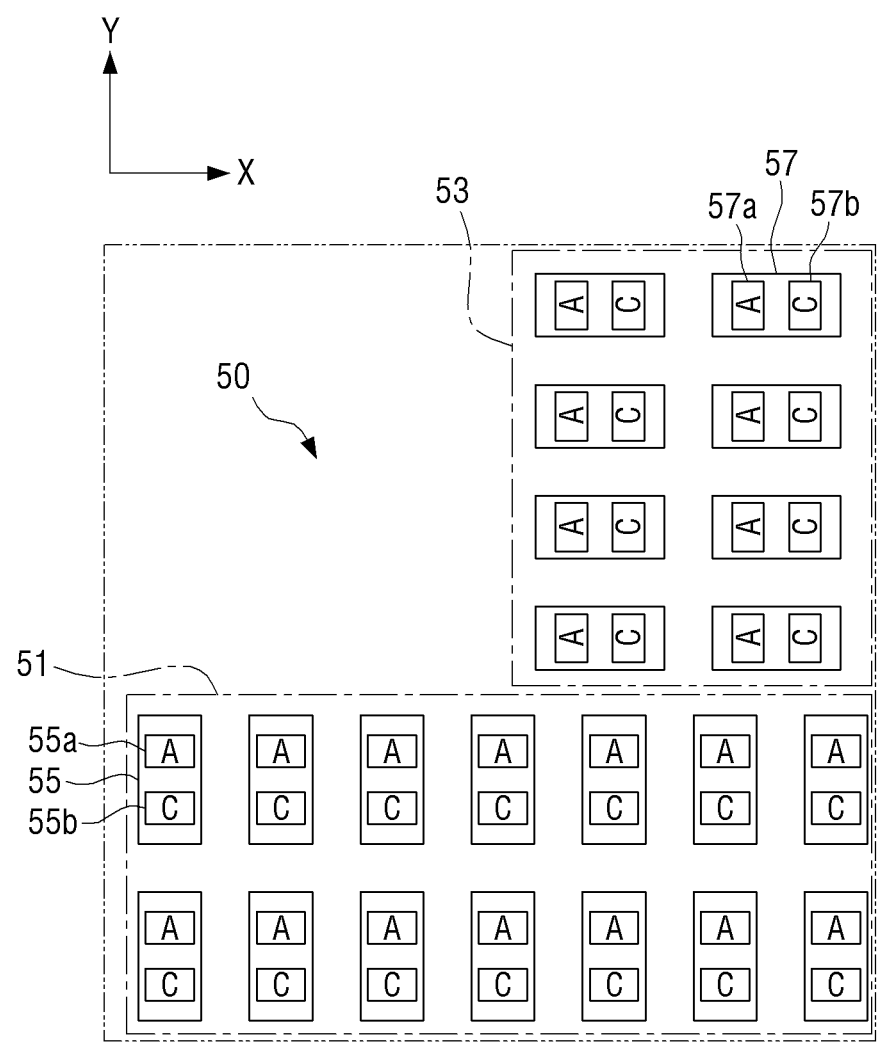
FIG. 4 is an enlarged view of section IV illustrated in FIG. 2.

FIG. 2 is a view illustrating a micro LED transfer substrate according to an embodiment of the disclosure, FIG. 3 is an enlarged view of part III illustrated in FIG. 2, and FIG. 4 is an enlarged view of part IV illustrated in FIG. 2.

The relay substrate 50 may include a glass substrate 58 (see FIG. 6), an adhesive layer 59 (see FIG. 6) formed on a front surface of the glass substrate 58, and a plurality of micro LEDs 55, 56, and 57 arranged on the adhesive layer 59.

The glass substrate 58 may be a transparent substrate formed of sapphire, silicon, or transparent glass to be used in a process in which the LLO is applied.

The adhesive layer 59 may be referred to as a dynamic release layer (DRL), and may be formed of a polyimide (PI) material to be easily separated at the time of transferring the micro LEDs 55, 56, and 57 to the target substrate 70 during the LLO process.

Referring to FIG. 2, the plurality of micro LEDs 55, 56, and 57 may be arranged in a plurality of partitioned regions on one surface (or a front surface) of the relay substrate 50 to maximize a utilization rate of the relay substrate 50. Here, the utilization rate refers to a degree of arranging as many micro LEDs as possible on the relay substrate 50.

In addition, the relay substrate 50 according to the disclosure may be manufactured in consideration of arrangement directions of the plurality of micro LEDs to use only a single mask without needing to replace a mask in a transfer process, to maximize the utilization rate and shorten a transfer process time.

Specifically, to maximize the utilization rate and shorten the transfer process time, a portion of the plurality of micro LEDs 55 may be arranged in a first region 51 of the relay substrate 50 set up to left and right edge portions of the relay substrate 50, and other portions of the plurality of micro LEDs 56 and 57 may be arranged in second and third regions 52 and 53 of the relay substrate 50 adjacent to a lower side and an upper side of the first region 51, respectively.

Referring to FIG. 3, the micro LEDs 55 of the first region 51 may include anode electrodes 55a and cathode electrodes 55b sequentially arranged along a first direction (a Y axis direction in FIG. 3). The micro LEDs 56 of the second region 52 may include anode electrodes 56a and cathode electrodes 56b sequentially arranged along a second direction (an X axis direction in FIG. 3) perpendicular to the first direction.

Referring to FIG. 4, the micro LEDs 57 of the third region 53 may include anode electrodes 57a and cathode electrodes 57b sequentially arranged along the second direction (the X axis direction in FIG. 3), similar to the micro LEDs 56 of the second region 52.

Referring to FIG. 2, the first region 51 may appear in a substantially rectangular shape, and the second and third regions 52 and 53 may appear in a rectangular shape smaller than the first region 51.

Here, a vertical length L1 of the first region 51 may be the same as a horizontal length L2 of the second region. This corresponds to a case where the number of micro LEDs 55 arranged along columns of the first region 51 and the number of micro LEDs 56 arranged along rows of the second region 52 are the same as each other, and a pitch between the micro LEDs 55 of the first region 51 and a pitch between the micro LEDs 56 of the second region 52 are the same as each other.

In addition, the vertical length L1 of the first region 51 may be the same as a horizontal length L3 of the third region. This corresponds to a case where the number of micro LEDs 55 arranged along the columns of the first region 51 and the number of micro LEDs 57 arranged along rows of the third region 53 are the same as each other, and the pitch between the micro LEDs 55 of the first region 51 and a pitch between the micro LEDs 57 of the third region 53 are the same as each other.

The growth substrates are not illustrated in the present figures, but at the time of growing the plurality of micro LEDs on the growth substrates, the plurality of micro LEDs may be formed in arrangements and arrangement directions that are the same as arrangements and arrangement directions (directions in which the anode electrodes and the cathode electrodes are arranged) of the micro LEDs 55, 56, and 57 of the respective regions 51, 52, and 53 on the relay substrate 50 described above.

Hereinafter, a process of transferring the micro LEDs to the target substrate 70 using the relay substrate 50 will be described with reference to FIGS. 5 to 9.

Figure 5:
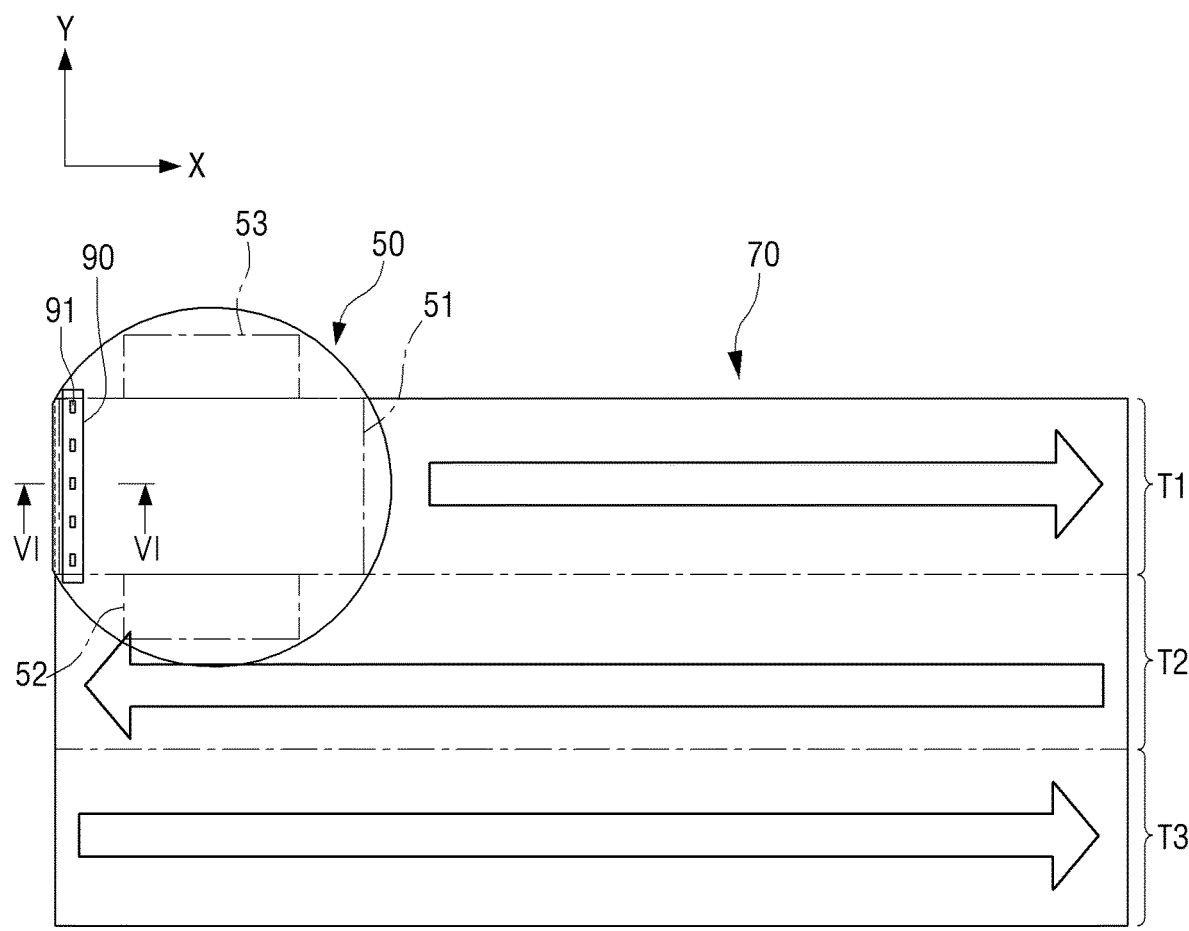
FIG. 5 is a schematic view illustrating an arrangement of each component for performing a micro LED transfer process according to an embodiment.
Figure 6:
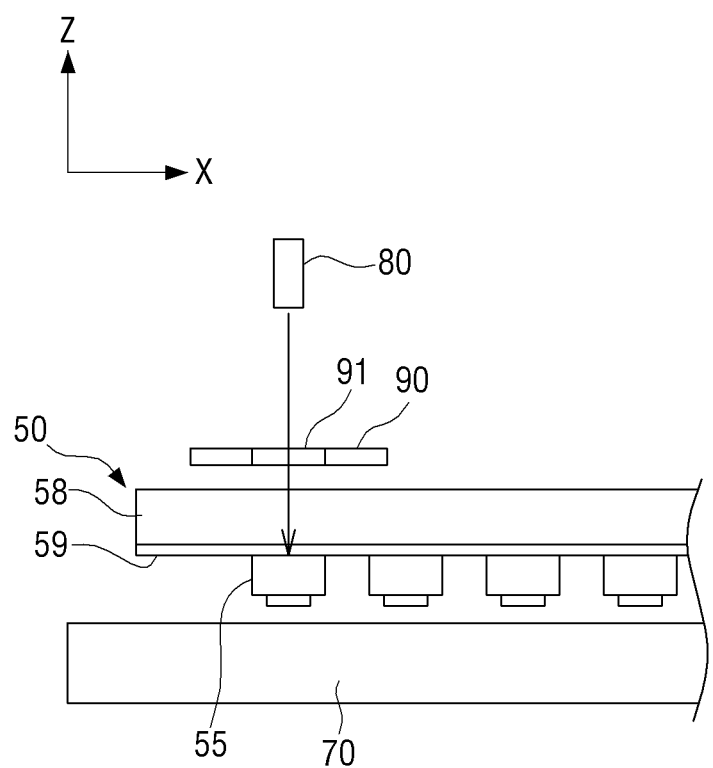
FIG. 6 is a schematic cross-sectional view taken along line VI-VI of FIG. 5.
Figure 7:
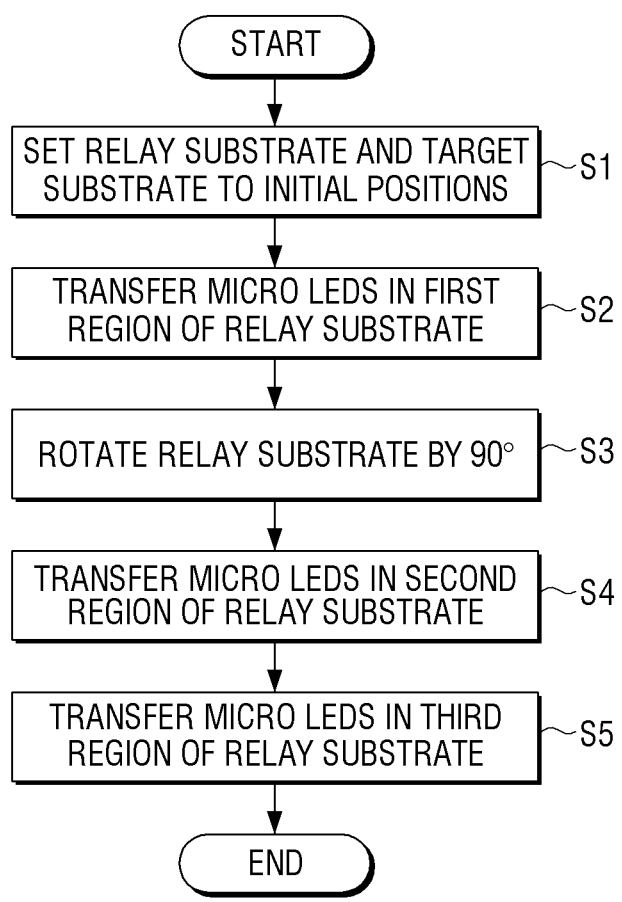
FIG. 7 is a flowchart illustrating a micro LED transfer process according to an embodiment.
Figure 8:
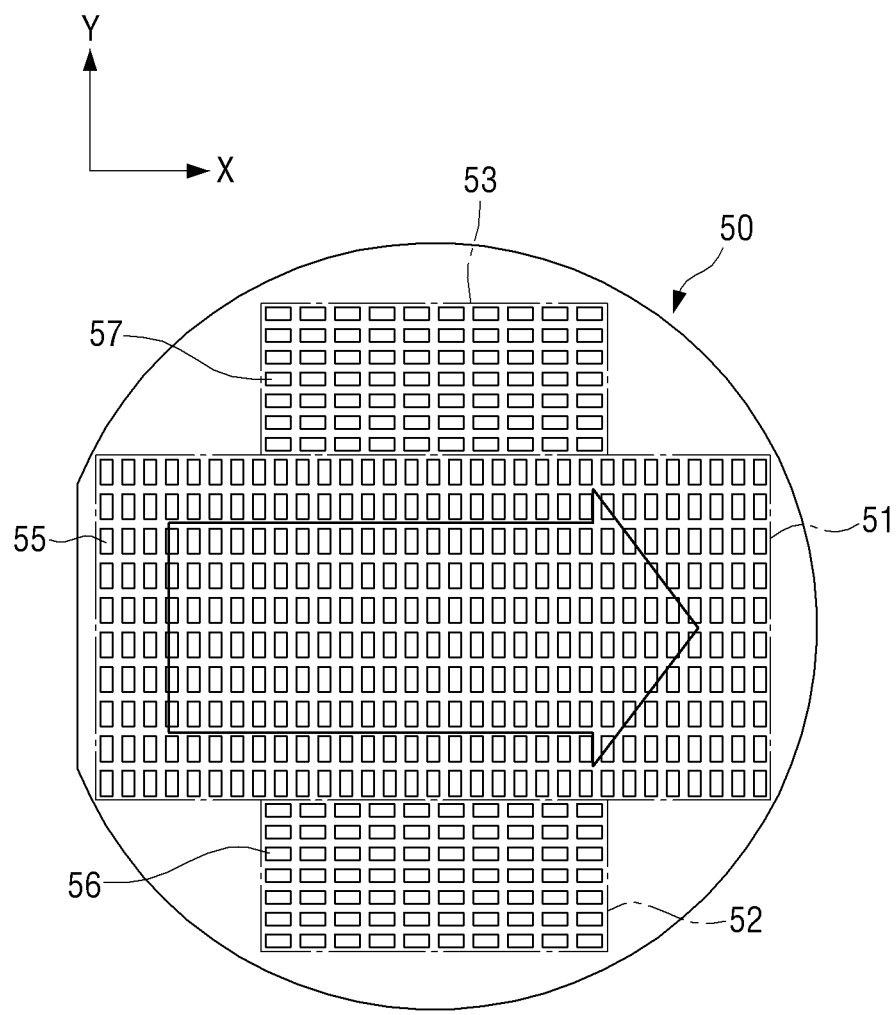
FIG. 8 is a schematic view illustrating a transfer direction of micro LEDs arranged in a first region of the micro LED transfer substrate according to an embodiment.
Figure 9:
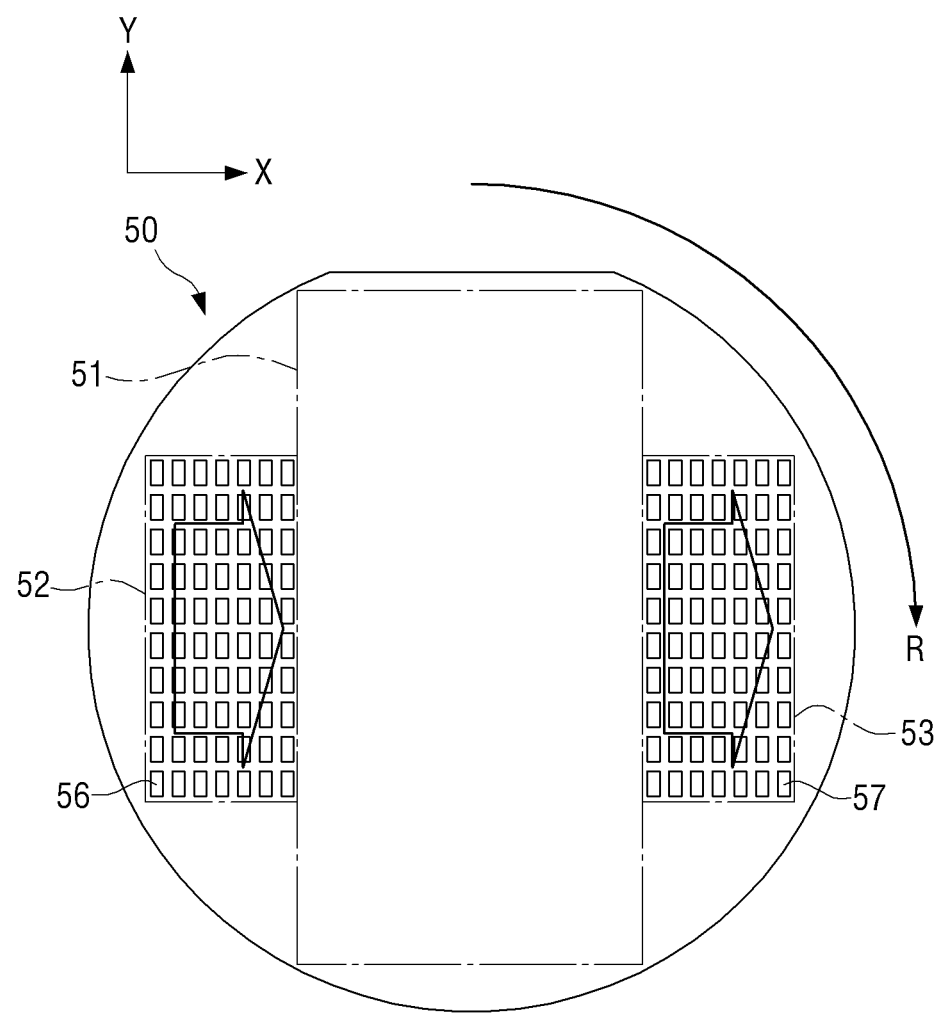
FIG. 9 is a schematic view illustrating a transfer direction of micro LEDs arranged in second and third regions of the micro LED transfer substrate according to an embodiment.

FIG. 5 is a schematic view illustrating an arrangement of each component for performing a micro LED transfer process according to an embodiment of the disclosure. FIG. 6 is a schematic cross-sectional view taken along line VI-VI of FIG. 5, FIG. 7 is a flowchart illustrating a micro LED transfer process according to an embodiment of the disclosure. FIG. 8 is a view illustrating a transfer direction of micro LEDs arranged in a first region of the micro LED transfer substrate according to an embodiment of the disclosure. FIG. 9 is a view illustrating a transfer direction of micro LEDs arranged in second and third regions of the micro LED transfer substrate according to an embodiment of the disclosure.

Referring to FIGS. 5 and 6, the target substrate 70 is fixed to the stage 20 (not illustrated) in a state where a target substrate 70 surface to which the micro LEDs are to be transferred faces the laser oscillator 80.

The relay substrate 50 is arranged so that the micro LEDs face the target substrate 70. In this state, the relay substrate 50 may be fixed to the stage 20 (not illustrated), and the stage 40 may move along the X axis and the Y axis to move the relay substrate 50 to a desired point along an X-Y plane.

In addition, when the micro LEDs 55 of the first region 51 are first transferred, the first region 51 of the relay substrate 50 may be arranged at a position corresponding to an upper left portion of the target substrate 70.

When a region of the target substrate 70 to which the micro LEDs are to be transferred is partitioned into first to third transfer regions T1, T2, and T3 arranged in parallel with each other, as illustrated in FIG. 5, a direction in which the micro LEDs are to be transferred to the target substrate 70 may be a zigzag direction while moving horizontally along the X axis direction from the first transfer region T1 to the third transfer region T3.

However, the direction in which the micro LEDs are to be transferred to the target substrate does not need to be limited to the zigzag direction as described above, and may be set from the left to the right along the X axis direction in the same manner for each of the transfer regions T1, T2, and T3 or be set from the right to the left along the X axis direction in the same manner for each of the transfer regions T1, T2, and T3.

In addition, a vertical length (a length in the Y axis direction of FIG. 5) of each of the transfer regions T1, T2, and T3 may be set to the same length as the vertical length L1 of the first region 51 and the horizontal lengths L2 and L3 of the second and third regions 52 and 53 of the relay substrate 50. In this configuration, the anode connection terminals and the cathode connection terminals are arranged in each of the transfer regions T1, T2, and T3 of the target substrate 70 to which the anode electrodes and the cathode electrodes of the micro LEDs 55 are connected, respectively. As such, the anode connection terminals and the cathode connection terminals are arranged in the same direction as that of the anode electrodes 55a and the cathode electrodes 55b corresponding to the first region 51 of the relay substrate 50. The anode connection terminals and the cathode connection terminals may be formed in a shape of a thin film pad on a TFT layer of the target substrate 70.

A mask 90 may be arranged above the relay substrate 50, and may be fixed without moving in the transfer process, similar to the laser oscillator 80. A plurality of openings 91 through which a laser beam, irradiated in a line form from the laser oscillator 80 toward the relay substrate 50, passes are formed in the mask 90.

Referring to FIG. 7, the relay substrate 50 and the target substrate 70 may be set to initial positions by stages (operation S1). The initial positions may be starting points for transferring the micro LEDs 55 arranged in the first region 51 of the relay substrate 50 to the first transfer region T1 of the target substrate 70.

When the laser beam is irradiated from the laser oscillator 80 to a predetermined point with respect to the relay substrate 50, a plurality of predetermined micro LEDs in a first row arranged in the first region 51 of the relay substrate 50 are separated from the adhesive layer 59 of the relay substrate 50 and are transferred to the first transfer region T1 of the target substrate 70 (operation S2).

Subsequently, the relay substrate 50 and the target substrate 70 move to the next transfer positions. In this case, movement distances of the relay substrate 50 and the target substrate 70 may be different from each other. The micro LEDs 55 arranged in the first region 51 of the relay substrate 50 may be sequentially transferred from the left to the right along the X axis direction as illustrated in FIG. 8.

When all of the micro LEDs 55 in the first region 51 of the relay substrate 50 are transferred to the target substrate 70, the relay substrate 50 is rotated by 90° in a clockwise direction as illustrated in FIG. 9 (operation S3). Therefore, the micro LEDs 56 and 57 arranged in the second and third regions 52 and 53 may be rotated to the same orientation as that of the micro LEDs 55 in the first region 51 of the relay substrate 50 on which the transfer has been previously performed.

That is, once the relay substrate has been rotated by 90 degrees, the micro LEDs 56 and 57 may be sequentially arranged along the Y axis direction so that an arrangement direction of the anode electrodes 56a and 57a and the cathode electrodes 56b and 57b of the micro LEDs 56 and 57 arranged in the second and third regions 52 and 53, respectively, is the same as that of the anode electrodes 55a and the cathode electrodes 55b of the micro LEDs 55 transferred to the target substrate 70.

Therefore, the mask 90 used at the time of transferring the micro LEDs 55 in the first region 51 of the relay substrate 50 may be used as is for transferring the micro LEDs 56 and 57 arranged in the second and third regions 52 and 53 without needing to be replaced. Thus, a tack time required due to replacement of the mask may be reduced, thus significantly shortening a transfer process time.

Subsequently, the micro LEDs 56 arranged in the second region 52 of the relay substrate 50 are moved to predetermined positions for being transferred to the target substrate 70. In this case, a transfer starting point of the target substrate 70 to which the micro LEDs 56 in the second region 52 of the relay substrate 50 are transferred may be a point following the last point at which the micro LEDs 55 in the first region 51 of the relay substrate 50 are transferred. In this state, the micro LEDs 56 in the second region 52 of the relay substrate 50 are transferred to the target substrate 70 (operation S4). In this case, the micro LEDs 56 arranged in the second region 52 of the relay substrate 50 may be sequentially transferred from the left to the right along the X axis direction as illustrated in FIG. 9.

When all of the micro LEDs 56 in the second region 52 of the relay substrate 50 are transferred to the target substrate 70, the relay substrate 50 may be moved to a point at which the micro LEDs 57 in the third region 53 of the relay substrate 50 are to be transferred to the target substrate 70 without being rotated.

Subsequently, the micro LEDs 57 in the third region 53 of the relay substrate 50 may be transferred to the target substrate 70 (operation S5). In this case, the micro LEDs 57 arranged in the third region 53 of the relay substrate 50 may be sequentially transferred from the left to the right along the X axis direction as illustrated in FIG. 9.

In a case where all of the micro LEDs 55, 56 and 57 in the first to third regions 51, 52 and 53 of the relay substrate 50 are transferred to the target substrate 70, when a region capable of accepting more micro LEDs remains in the transfer regions T1, T2, and T3 of the target substrate 70, additional micro LEDs may be transferred to the target substrate 70 from the last transfer point after the relay substrate 50 is replaced with a new relay substrate 50.

As described above, according to the disclosure, the transfer process may be performed using only a single mask 90 without replacing the mask, and a mask replacing step may thus be omitted, such that the transfer process time may be significantly shortened.

Figure 10:
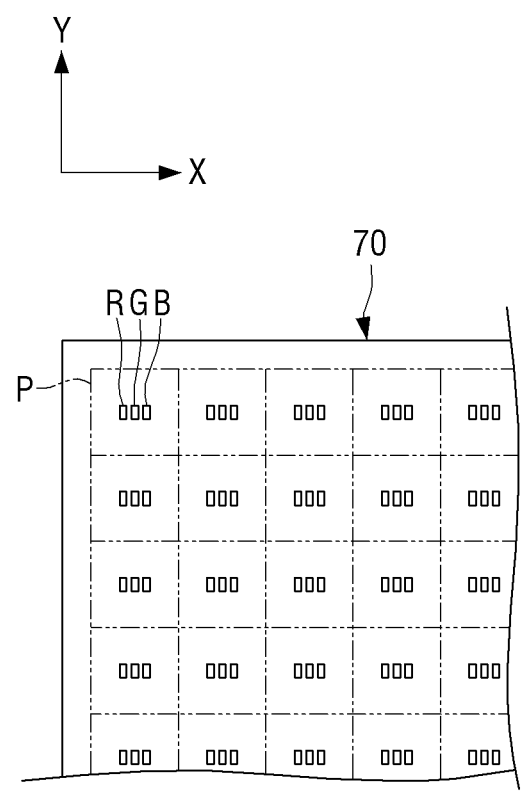
FIG. 10 is a plan view illustrating a part of a display module according to an embodiment.

FIG. 10 is a view illustrating an arrangement of the plurality of micro LEDs that have been transferred from the relay substrate 50 to the target substrate 70 according to an embodiment.

Referring to FIG. 10, red, green, and blue micro LEDs may form one pixel P on the target substrate 70, and a plurality of pixels may be arranged to maintain a predetermined pitch therebetween. In this case, each pixel P may further include a white micro LED. Additionally, one pixel P may include a driving circuit (not illustrated) for driving each micro LED.

In addition, the pixels P transferred to the target substrate 70 do not need to be limited to a form in which they are arranged in a line as illustrated in FIG. 9, and may be arranged in various forms.

In the disclosure, the target substrate 70 may include a thin film transistor (TFT) layer (not illustrated) formed on a front surface thereof on which the plurality of micro LEDs are transferred. Anode electrodes and cathode electrodes of the plurality of micro LEDs transferred to the target substrate 70 may be electrically connected to respective driving circuits provided in the TFT layer at the time of transferring the plurality of micro LEDs. In addition, the target substrate 70 may include a wiring (not illustrated) electrically connecting the TFT layer and a circuit (not illustrated) arranged on a rear surface of the target substrate 70 to each other. In this case, the wiring may be formed on a side surface (or an edge region) of the target substrate 70.

The target substrate 70, including each of the components as described above, may be a display module. A plurality of display modules may be connected to each other in various forms such as a straight line form or a lattice form to implement a large display apparatus.

It is also possible to arrange the micro LEDs 55, 56, and 57 in each of the regions 51, 52, and 53 of the relay substrate 50 described above in somewhat different arrangement directions, which will be described with reference to FIGS. 11 and 12.

Figure 11:
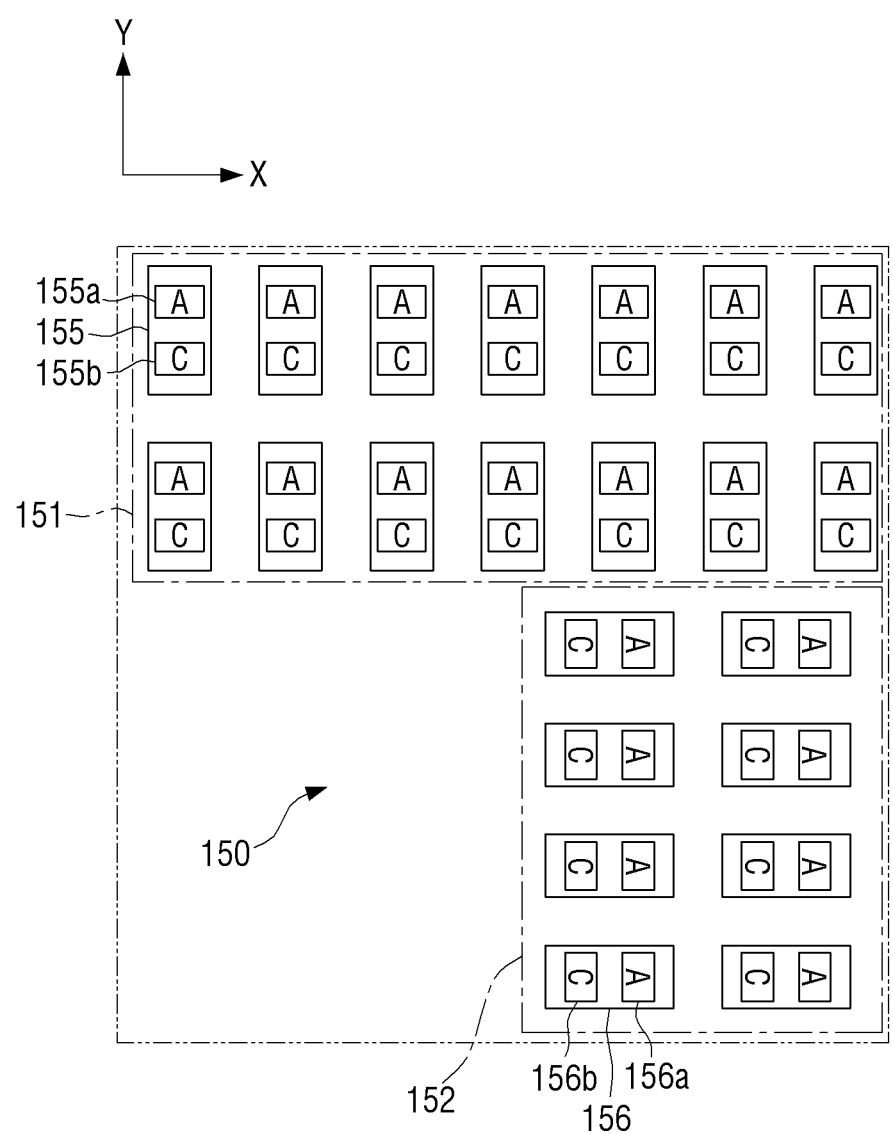
FIG. 11 is an enlarged view of section III illustrated in FIG. 2 according to another embodiment.
Figure 12:
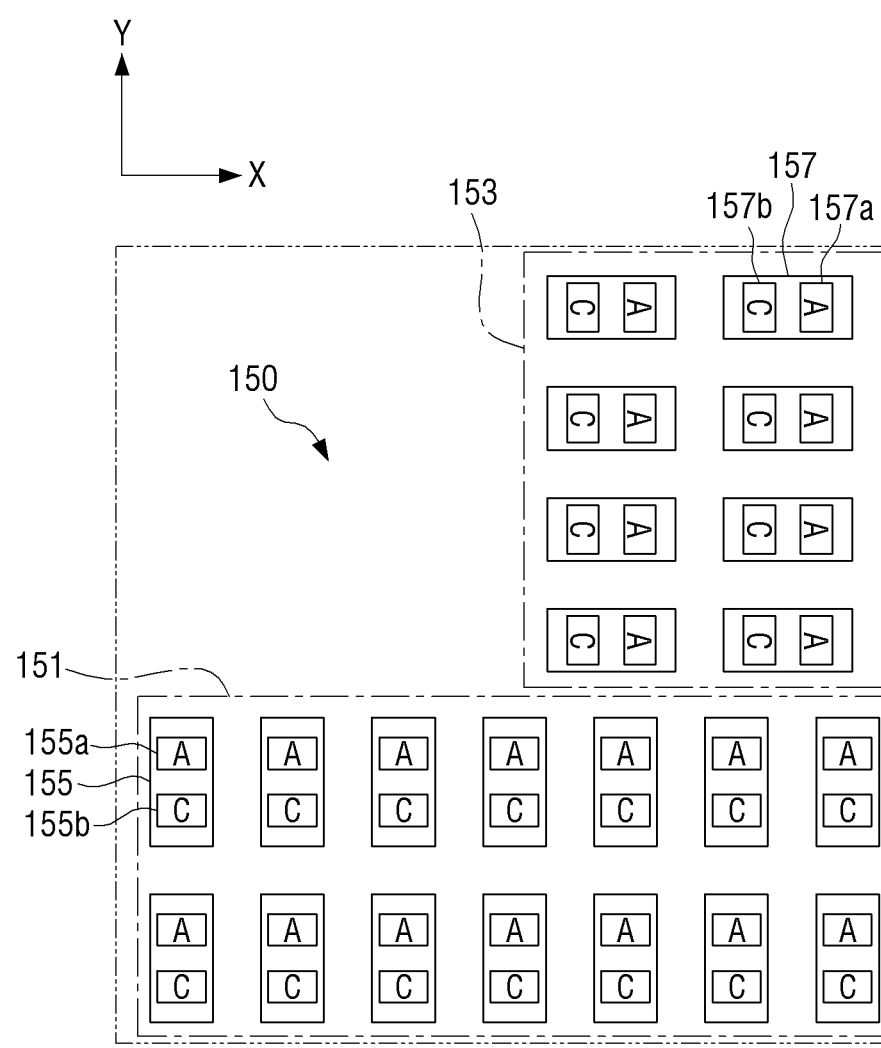
FIG. 12 is an enlarged view of section IV illustrated in FIG. 2 according to another embodiment.

FIGS. 11 and 12 are enlarged views of respective portions of a micro LED transfer substrate (relay substrate 150) according to another embodiment of the disclosure.

The relay substrate 150 according to an embodiment of the disclosure is different from the relay substrate 50 described above with respect to arrangement directions (directions and an order in which anode electrodes and cathode electrodes are arranged) of micro LEDs 156 and 157 arranged in second and third regions 152 and 153, respectively.

That is, referring to FIG. 11, anode electrodes 155a and cathode electrodes 155b of micro LEDs 155 arranged in a first region 151 of the relay substrate 150 may be arranged in the order of the anode electrode 155a followed by the cathode electrode 155b along a first direction (a Y-axis direction in FIG. 11), like the micro LEDs 55 arranged in the first region 51 of the relay substrate 50 described above.

However, anode electrodes 156a and cathode electrodes 156b of the micro LEDs 156 in the second region 152 of the relay substrate 150 may be arranged in the order of the cathode electrode 156b followed by the anode electrode 156a along a second direction (an X-axis direction in FIG. 11) perpendicular to the first direction, unlike the micro LEDs 56 in the second region 52 of the relay substrate 50 described above.

In addition, referring to FIG. 12, anode electrodes 157a and cathode electrodes 157b of the micro LEDs 157 in the third region 153 of the relay substrate 150 may be arranged in the order of the cathode electrode 157b followed by the anode electrode 157a along the second direction (the X-axis direction in FIG. 12), similar to the micro LEDs 156 in the second region 152, unlike the micro LEDs 57 in the third region 53 of the relay substrate 50 described above.

In a case where such a relay substrate 150 is used in a transfer process, when all of the micro LEDs 155 in the first region 151 of the relay substrate 150 are transferred, after the relay substrate 150 is rotated by 90° in a counterclockwise direction, the micro LEDs 157 in the third region 153 may be transferred and the micro LEDs 156 in the second region 152 may then be transferred.

Although multiple embodiments of the disclosure have been individually described hereinabove, the respective embodiments are not necessarily implemented individually, and may also be implemented so that configurations and operations thereof are combined with those of one or more other embodiments.

Although the embodiments of the disclosure have been illustrated and described hereinabove, the disclosure is not limited to the specific embodiments described above, but may be variously modified by those skilled in the art to which the disclosure pertains without departing from the scope of the disclosure claimed in the claims. These modifications should also be understood to fall within the scope of the disclosure.

What is claimed is:

1. A micro light emitting diode (LED) transferring method comprising:
   setting a micro LED transfer substrate and a target substrate to initial positions;
   transferring a plurality of micro LEDs arranged in a partial region of the micro LED transfer substrate to the target substrate;
   rotating the micro LED transfer substrate; and
   transferring a plurality of micro LEDs arranged in a remaining region of the rotated micro LED transfer substrate to the target substrate,
   wherein the rotating of the micro LED transfer substrate comprises rotating the micro LED transfer substrate by 90° in a clockwise direction or a counterclockwise direction,
   wherein an arrangement direction of the micro LEDs in the partial region is perpendicular to an arrangement direction of the micro LEDs in the remaining region,
   wherein anode electrodes and cathode electrodes of the micro LEDs in the partial region are arranged in an order of the anode electrode followed by the cathode electrode along a first direction, and
   wherein anode electrodes and cathode electrodes of the micro LEDs in the remaining region are arranged in an order of the anode electrode followed by the cathode electrode along a second direction perpendicular to the first direction.

2. A micro light emitting diode (LED) transferring method, the method comprising:
   setting a micro LED transfer substrate and a target substrate to initial positions;
   transferring a plurality of micro LEDs arranged in a partial region of the micro LED transfer substrate to the target substrate;
   rotating the micro LED transfer substrate; and
   transferring a plurality of micro LEDs arranged in a remaining region of the rotated micro LED transfer substrate to the target substrate,
   wherein the rotating of the micro LED transfer substrate comprises rotating the micro LED transfer substrate by 90° in a clockwise direction or a counterclockwise direction,
   wherein an arrangement direction of the micro LEDs in the partial region is perpendicular to an arrangement direction of the micro LEDs in the remaining region, and
   wherein anode electrodes and cathode electrodes of the micro LEDs in the partial region are arranged in the order of the anode electrode followed by the cathode electrode along a first direction, and
   wherein anode electrodes and cathode electrodes of the micro LEDs in the remaining region are arranged in the order of the cathode electrode followed by the anode electrode along a second direction perpendicular to the first direction.

3. The micro LED transferring method as claimed in claim 1, wherein the transferring the plurality of micro LEDs arranged in the partial region of the micro LED transfer substrate to the target substrate comprises moving the micro LED transfer substrate along a plurality of transfer regions partitioned in parallel with each other on the target substrate, and the transferring the plurality of micro LEDs arranged in the remaining region of the rotated micro LED transfer substrate to the target substrate comprises moving the micro LED transfer substrate along the plurality of transfer regions partitioned in parallel with each other on the target substrate.

4. The micro LED transferring method as claimed in claim 3, wherein a vertical length of each of the plurality of transfer regions of the target substrate is the same as a vertical length of the partial region of the micro LED transfer substrate.

5. The micro LED transferring method as claimed in claim 4, wherein a horizontal length of the remaining region of the micro LED transfer substrate is the same as the vertical length of each of the plurality of transfer regions of the target substrate.

6. A non-transitory computer readable recording medium storing instructions, the instructions comprising: one or more instructions that, when executed by one or more processors of a device, cause the one or more processors to execute a micro LED transferring method, the micro LED transferring method comprising:
   setting a micro LED transfer substrate and a target substrate to initial positions;
   transferring a plurality of micro LEDs arranged in a partial region of the micro LED transfer substrate to the target substrate;
   rotating the micro LED transfer substrate; and
   transferring a plurality of micro LEDs arranged in a remaining region of the rotated micro LED transfer substrate to the target substrate,
   wherein the rotating of the micro LED transfer substrate comprises rotating the micro LED transfer substrate by 90° in a clockwise direction or a counterclockwise direction,
   wherein an arrangement direction of the micro LEDs in the partial region is perpendicular to an arrangement direction of the micro LEDs in the remaining region, wherein anode electrodes and cathode electrodes of the micro LEDs in the partial region are arranged in an order of the anode electrode followed by the cathode electrode along a first direction, and wherein anode electrodes and cathode electrodes of the micro LEDs in the remaining region are arranged in an order of the anode electrode followed by the cathode electrode along a second direction perpendicular to the first direction.

* * * * *